United States Patent
Yuan et al.

(10) Patent No.: US 9,742,397 B2
(45) Date of Patent: Aug. 22, 2017

(54) APPARATUS FOR OFFSET CORRECTION IN ELECTRONIC CIRCUITRY AND ASSOCIATED METHODS

(71) Applicant: Silicon Laboratories Inc., Austin, TX (US)

(72) Inventors: Gang Yuan, Austin, TX (US); Shouli Yan, Austin, TX (US); Matthew Powell, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/955,008

(22) Filed: Nov. 30, 2015

(65) Prior Publication Data

US 2017/0155386 A1 Jun. 1, 2017

(51) Int. Cl.
*H03F 1/02* (2006.01)
*H03K 17/687* (2006.01)
*H03F 3/45* (2006.01)

(52) U.S. Cl.
CPC ......... *H03K 17/687* (2013.01); *H03F 1/0205* (2013.01); *H03F 3/45179* (2013.01); *H03F 2203/45038* (2013.01)

(58) Field of Classification Search
CPC ............. H03F 1/02; H03F 3/45; H03F 1/0205
USPC ...................... 330/9; 327/124, 307
See application file for complete search history.

(56) References Cited

U.S. PATENT DOCUMENTS

| | | | |
|---|---|---|---|
| 4,322,687 A | 3/1982 | Dwarakanath et al. | |
| 5,508,656 A | 4/1996 | Jaffard et al. | |
| 5,726,597 A * | 3/1998 | Petty ................... | H03F 3/45762 327/307 |
| 6,531,907 B2 | 3/2003 | Dooley et al. | |
| 6,882,218 B2 | 4/2005 | Gupta | |
| 7,248,105 B2 | 7/2007 | Koen | |
| 7,302,246 B2 | 11/2007 | Tseng et al. | |
| 7,385,442 B1 | 6/2008 | Ripley | |
| 7,538,606 B2 | 5/2009 | Ripley | |
| 7,973,596 B2 | 7/2011 | Eschauzier et al. | |
| 8,400,337 B1 * | 3/2013 | Xu ...................... | H03F 3/45183 327/307 |
| 2003/0214351 A1 | 11/2003 | Nandy et al. | |
| 2016/0036419 A1* | 2/2016 | Lin ...................... | H03K 3/0375 327/198 |

OTHER PUBLICATIONS

Analog Devices, MT-037 Tutorial, "Op Amp Input Offset Voltage," Rev. 0, Oct. 2008 (10 pgs.).

* cited by examiner

*Primary Examiner* — Steven J Mottola
(74) *Attorney, Agent, or Firm* — Law Offices of Maximilian R. Peterson

(57) ABSTRACT

An apparatus includes a first field effect transistor (FET) that has a body and is coupled in a circuit. The apparatus also includes a second FET that has a body and is coupled in the circuit. The circuit has an offset because of a mismatch. The apparatus further includes an offset correction circuit coupled to the body of the first FET and to the body of the second FET. The offset correction circuit provides a first offset correction signal to the body of the first FET and provides a second offset correction signal to the body of the second FET.

20 Claims, 6 Drawing Sheets

APPARATUS FOR OFFSET CORRECTION IN ELECTRONIC CIRCUITRY AND ASSOCIATED METHODS

TECHNICAL FIELD

The disclosure relates generally to improving performance of electronic circuitry and, more particularly, to apparatus for offset correction or trimming in electronic circuitry, and associated methods.

BACKGROUND

Digital circuits and techniques have proliferated over time and have become ubiquitous with advances in semiconductor processing, circuit and system techniques, etc. The physical world and phenomena in nature, however, include analog quantities. Sensing, detecting, and processing the analog quantities entails using a variety of analog circuitry.

The performance of circuits, subsystems, and systems that include such analog circuitry depends in part on the performance of the analog circuitry. In practical, real-world implementations, electronic circuits like integrated circuits (ICs), including analog circuitry included in ICs, deviate from ideal behavior, with corresponding effects on their performance. A variety of performance measures exist and are used to gauge the performance of the analog circuitry. Examples include offset, distortion, gain, noise figure, power consumption, etc.

The description in this section and any corresponding figure(s) are included as background information materials. The materials in this section should not be considered as an admission that such materials constitute prior art to the present patent application.

SUMMARY

A variety of apparatus and associated methods are contemplated for offset trimming in electronic circuitry. According to an exemplary embodiment, an apparatus includes a first field effect transistor (FET) that has a body and is coupled in a circuit. The apparatus also includes a second FET that has a body and is coupled in the circuit. The circuit has an offset because of a mismatch. The apparatus further includes an offset correction circuit coupled to the body of the first FET and to the body of the second FET. The offset correction circuit provides a first offset correction signal to the body of the first FET and provides a second offset correction signal to the body of the second FET.

According to another exemplary embodiment, an electronic apparatus includes a differential amplifier that includes first and second transistors, each of which has a respective body. The electrical characteristics of the first transistor differ from electrical characteristics of the second transistor. The electronic apparatus also includes an offset correction circuit that includes a current source, and third and fourth transistors coupled to the first current source. The offset correction circuit further includes a network of a set of switches and of a set of resistors coupled to the third and fourth transistors to provide first and second offset correction signals to the body of the first transistor and to the body of the second transistor, respectively.

According to another exemplary embodiment, a method of correcting an offset in a circuit including first and second field effect transistors (FETs) is disclosed, where the circuit has an offset because of a mismatch. The method includes generating a first offset correction signal, and generating a second offset correction signal. The method also includes applying the first offset correction signal to a body of the first FET, and applying the second offset correction signal to a body of the second FET.

BRIEF DESCRIPTION OF THE DRAWINGS

The appended drawings illustrate only exemplary embodiments and therefore should not be considered as limiting the scope of the application or the claims. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
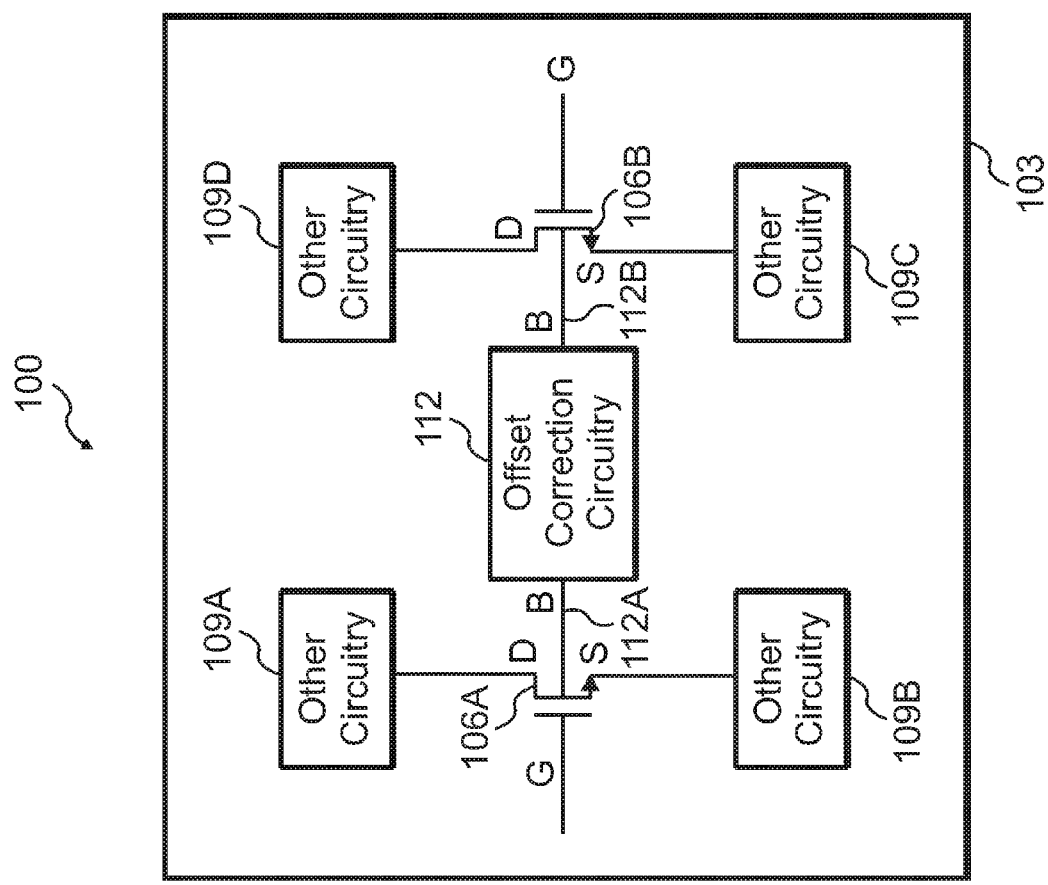
FIG. 1 illustrates a circuit arrangement for offset correction according to an exemplary embodiment.

The disclosed concepts relate generally to apparatus and methods for offset trimming in electronic circuitry. Offset, such as offset voltage, arises in electronic circuitry because of mismatch among various components, such as transistors, resistors, capacitors, various semiconductors (e.g., diodes), fabrication imperfections, etc. For instance, when two transistors, such as field effect transistors (FETs), metal oxide semiconductor (MOS) transistors, or metal oxide FETs (MOSFETs) have differing characteristics, a circuit that includes the transistors might exhibit a mismatch that gives rise to an offset in the circuit that includes the two transistors. In addition, or instead, mismatch between various elements or components (or set of mismatch conditions between or among various sets of components or elements) might cause an offset that adds or contributes to offset because of mismatch between other components or elements, thus giving rise to an overall or cumulative offset for the circuit that includes the components or elements.

As an example, if the two transistors are coupled as a differential pair (or differential amplifier), the output voltage of the differential pair should be zero if the input voltages are equal (e.g., zero or grounded). Because of practical, non-ideal implementation of transistors, such as MOSFETs, however, a practical differential pair may have a finite (i.e., non-zero) output voltage even when its inputs have the same voltage. The finite output voltage, arising from the mismatch between the transistors, constitutes the offset voltage. Other types of mismatch or other mismatch conditions between or among various elements or components might also give rise to an offset. For example, in the case of the differential pair, a mismatch between the load circuits (e.g., resistors) used for the respective two transistors in the differential pair may also give rise to, or contribute to, an offset.

As another example, consider an operational amplifier coupled in a unity-gain configuration (i.e., the output coupled to the inverting input). In such a configuration, grounding the non-inverting input should ideally produce a zero output. In practice, however, a grounded (i.e., zero volts) non-inverting input typically produces a finite (non-zero) output signal. The output signal constitutes the output offset voltage of the unity-gain configuration.

Generally, one may consider offset voltages as a voltage applied at an input to produce a zero output. More specifically, considering the differential pair discussed above, an offset voltage constitutes a differential voltage applied at the inputs of the differential pair that would result in a zero signal at the output of the differential pair.

Given the unity gain of an operational amplifier with its output coupled to its inverting input, as described above, the offset voltage may be referred to the input of the circuit. In other words, because of non-inverting property of the circuit, an input signal equal to the offset voltage would produce a zero output signal.

One aspect of the disclosed concepts relates to apparatus and methods for offset correction or trimming in electronic circuitry, such as offset voltages discussed above. The disclosed offset correction or trimming techniques do not use a clock signal, which results in relatively low power consumption of such circuits. The lower power consumption of the offset correction or trimming circuits beneficially affects the overall power consumption of the apparatus that includes the offset trimming circuits.

In addition, the disclosed techniques have less of an impact on performance metrics in certain applications. For example, when applied to differential pairs, the disclosed offset trimming techniques impact common mode rejection performance of the differential pair when compared to techniques such as trimming transistor geometries or the size of transistor drain currents.

FIG. 1 illustrates a circuit arrangement 100 for offset correction according to an exemplary embodiment. Circuit arrangement 100 includes IC 103, which includes a variety of types of circuitry, including transistors 106A-106B. Each of transistors 106A-106B has a drain, a source, a gate, and a bulk or body. The drains f transistors 106A-106B couple to other circuitry in IC 103, labeled respectively as 109A and 109D. The sources of transistors 106A-106B couple to other circuitry in IC 103, labeled respectively as 109B and 109C.

Other circuitry 109A-109D may include a variety of circuits, devices, subsystems, systems, blocks of transistors, circuit blocks, and the like, as desired, and as persons of ordinary skill in the art will understand. The quality and quantity of circuitry in other circuitry 109A-109D depends on factors such as the desired or specified functionality for circuit arrangement 100, as persons of ordinary skill in the art will understand. Examples include bias circuits, decoupling circuits, coupling circuits, supply circuits, current mirrors, current and/or voltage sources, filters, amplifiers, converters (e.g., analog-to-digital converters (ADCs) and digital-to-analog converters (DACs)), signal processing circuits (e.g., multipliers), detectors, and the like.

The gates of transistors 106A-106B are driven by circuitry (not shown) in order to provide bias, input voltages, etc., as persons of ordinary skill in the art will understand. The details of the circuitry driving the gates of transistors 106A-106B depends on factors such as the desired or specified functionality for circuit arrangement 100, as persons of ordinary skill in the art will understand.

As merely one example, in some embodiments, transistors 106A-106B may be used in an amplifier. In such a scenario, one or more input voltages (e.g., a differential input voltage that includes positive and negative voltages with respect to supply ground ($V_{SS}$)) may drive the gates of transistors 106A-106B. Other configurations may be used, depending on factors such as desired functionality, specifications, or overall characteristics of circuit arrangement 100, as persons of ordinary skill in the art will understand.

Transistors 106A-106B are similar to each other but, as persons of ordinary skill in the art will understand, in a practical implementation, they have finite differences from each other that gives rise to an offset signal, such as an offset voltage. In other words, although circuit designers typically seek to match transistors 106A-106B such that they have identical characteristics, such as electrical characteristics (e.g., threshold voltage), in a practical implementation, transistors 106A-106B often do not have identical characteristics, i.e., a mismatch exists between transistors 106A-106B. One or more offset signals might arise also from mismatch among other circuit components or elements, as discussed above. For example, mismatch between other circuitry 109A and 109D, between other circuitry 109B and 109C, and/or between other circuit components or elements in the circuit, might give rise to one or more offset signals. Thus, generally speaking, mismatch between transistors 106A-106B might constitute merely one source of offset in the circuit, and other sources of offset may exist and contribute to the circuit's overall or cumulative offset. Similar comments apply to the circuit arrangements in FIGS. 2-6, as well as virtually all practical circuit implementations, as persons of ordinary skill in the art will understand.

As a result of the differences in the characteristics of transistors 106A-106B and/or other circuit components or elements, as discussed above, one or more offset signals, such as offset voltages, may arise. Offset correction circuit 112 trims or corrects the offset voltage (or substantially trims or corrects the offset in a practical, real-world implementation), as described below in detail.

As noted, in various embodiments, some circuits in IC 103 use transistors, such as MOSFETs 106A-106B, described above. The drain current of a MOSFET in the saturation region of operation depends on the threshold voltage and the gate-to-source voltage of the transistor, i.e., $$i_D = K(v_{GS} - V_T)^2,$$

where $i_D$ constitutes the total drain current (i.e., including AC and DC components), K represents a constant, $v_{GS}$ constitutes the total gate-to-source voltage (i.e., including AC and DC components), and $V_T$ denotes the threshold voltage. (Note that, for the sake of clarity of presentation of the concepts, the above equation omits the dependence of the drain current on the drain-source voltage.)

A MOSFET typically has two transconductance quantities associated with it. One transconductance depends on the gate-source voltage, $v_{GS}$. Another transconductance depends on the bulk-source voltage, $v_{BS}$. The overall transconductance of the MOSFET depends on both $v_{GS}$ and $v_{BS}$.

More specifically, the overall transconductance, $g_{m,overall}$, may be expressed as:

$$g_{m,overall} = \frac{\partial i_D}{\partial v_{GS}} + \frac{\partial i_D}{\partial v_{BS}},$$

(assuming for the partial derivatives constant $v_{BS}$ and constant $v_{GS}$, respectively). Expressed differently, $$g_{m,overall} = g_m + g_{mbs},$$

-continued where $$g_m = \frac{\partial i_D}{\partial v_{GS}} = 2K(V_{GS} - V_T),$$

and $$g_{mbs} = \frac{\partial i_D}{\partial v_{BS}}.$$

Thus, as noted above, the transconductance of the MOSFET depends not only on the gate-source voltage ($v_{GS}$), but also on body-gate (or bulk-gate) voltage ($v_{BS}$).

As a result, the drain current depends on both the gate-source voltage ($v_{GS}$), and the body-gate (or bulk-gate) voltage ($v_{BS}$):

$$i_D = g_m v_{GS} + g_{mbs} v_{BS}.$$

If an offset voltage is referred to the gate voltage as $v_{osi}$, then an additional offset trim or correction voltage, $v_{btrim}$, applied to the bulk, may be used for offset correction. The resulting effect on the drain current may be expressed as:

$$i_D = g_m(v_{GS} + v_{osi}) + g_{mbs}(v_{GS} + v_{btrim}).$$

Selecting particular values of $v_{btrim}$ can cause the offset to be trimmed or corrected. More specifically, if the following condition exists, the offset is trimmed out or corrected:

$$v_{btrim} = \frac{-g_m}{g_{mbs}} \cdot v_{osi}.$$

Offset correction circuit 112 applies the value of $v_{btrim}$ according to the above equation to the bulk or body of MOSFET(s) in order to trim or correct the offset voltage (or substantially trim or correct the offset in a practical, real-world implementation, i.e., to a value near zero, or reduce the offset voltage by a percentage, say, 70%, 80%, 90%, etc.).

In some embodiments, the offset correction voltage, $v_{btrim}$, may be applied as a differential voltage to two transistors, differences between which gives rise to an offset. In some embodiments, the offset correction voltage may be applied to one transistor (e.g., as a single-ended voltage with respect to ground potential (e.g., $V_{SS}$), the differences between which and another transistor gives rise to an offset.

Figure 2:
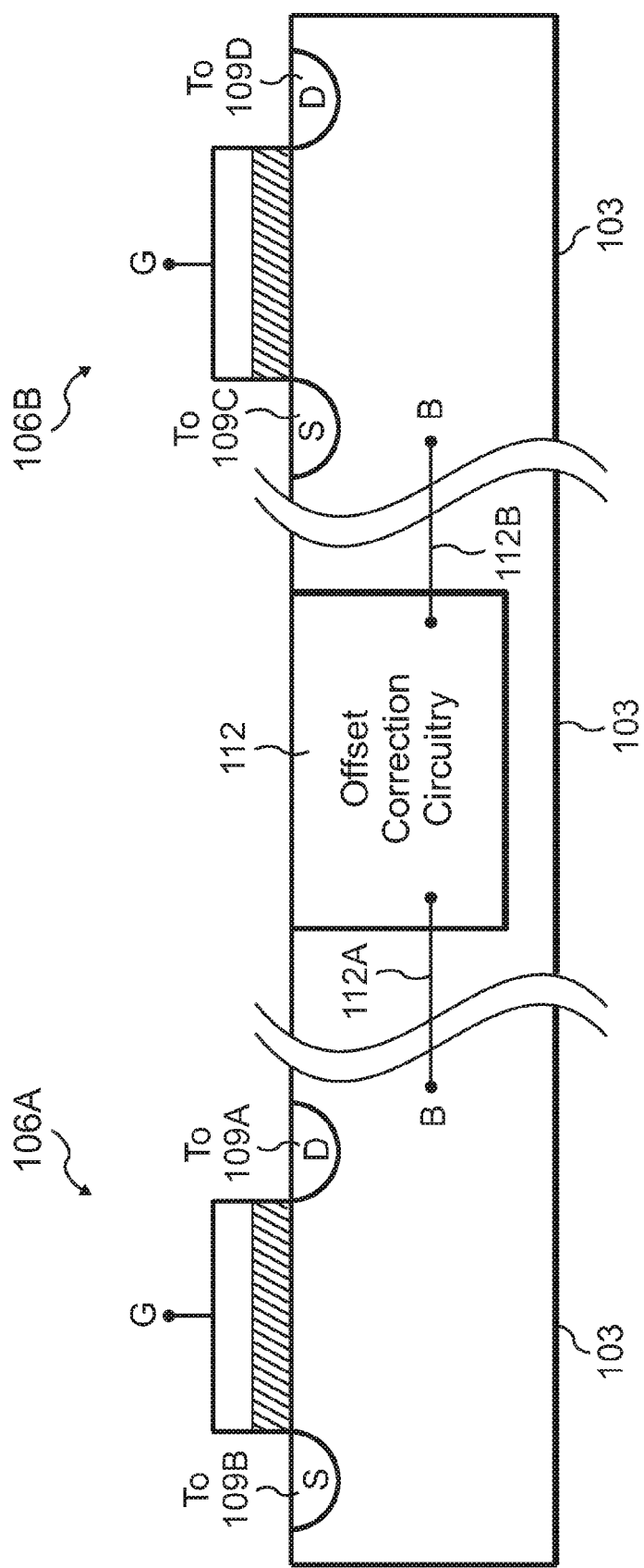
FIG. 2 depicts application of an offset correction voltage to the bulk or body of transistors according to an exemplary embodiment.

FIG. 2 depicts application of an offset correction voltage to the bulk or body of two transistors according to an exemplary embodiment. More specifically, FIG. 2 illustrates a cross-section of an IC 103 that includes transistors 106A and 106B, and offset correction circuit 112. Differences between transistors 106A-106B give rise to an offset, such as an offset voltage.

Referring again to FIG. 2, transistor 106A is implemented in a semiconductor bulk, which constitutes the body of transistor 106A, in IC 103. The bulk or body of transistor 106A is doped appropriately to provide desired characteristics of transistor 106A, as persons of ordinary skill in the art will understand. For example, for an n-channel transistor 106A, the body is doped with a p-type impurity or additive.

Transistor 106A also includes source and drain regions, labeled "S" and "D," respectively. The source and drain regions have an opposite doping type than the doping of the body of transistor 106A, as persons of ordinary skill in the art will understand. For example, for an n-channel transistor 106A, the source and drain regions would have n-type doping.

Transistor 106A also includes a gate, labeled "G" in FIG. 2. The gate of transistor 106A is formed above an insulation layer (e.g., silicon dioxide), as persons of ordinary skill in the art will understand.

Offset correction circuit 112 provides offset correction voltage 112A to transistor 106A. More specifically, offset correction circuit 112 applies offset correction voltage 112A to the body or bulk of transistor 106A in order to correct the offset discussed above.

As noted, IC 103 also includes transistor 106B. Transistor 106B is implemented in a semiconductor bulk, which constitutes the body of transistor 106B, in IC 103. The bulk or body of transistor 106B is doped appropriately to provide desired characteristics of transistor 106B, as persons of ordinary skill in the art will understand. For example, for an n-channel transistor 106B, the body is doped with a p-type impurity or additive.

Transistor 106B also includes source and drain regions, labeled "S" and "D," respectively. The source and drain regions have an opposite doping type than the doping of the body of transistor 106B, as persons of ordinary skill in the art will understand. For example, for an n-channel transistor 106B, the source and drain regions would have n-type doping.

Transistor 106B also includes a gate, labeled "G" in FIG. 2. The gate of transistor 106B is formed above an insulation layer (e.g., silicon dioxide), as persons of ordinary skill in the art will understand.

Offset correction circuit 112 provides offset correction voltage 112B to transistor 106B. More specifically, offset correction circuit 112 applies offset correction voltage 112B to the body or bulk of transistor 106B in order to correct the offset discussed above.

Note that, for the sake of clarity of presentation, FIG. 2 shows offset correction circuit 112 as a block, rather than a collection of inter-coupled transistors, devices (e.g., resistors), interconnects, etc. As persons of ordinary skill in the art will understand, however, offset correction circuit 112 includes a set of transistors, devices, and the like, in a physical implementation.

Note further that although FIG. 2 shows transistors 106A-106B implemented in the bulk of an IC 103, the structures used to implement transistors 106A-106B may include features to provide isolation (e.g., isolation islands) between the bodies or bulks of transistors 106A-106B. The isolation between the bodies of transistors 106A-106B allows offset correction circuit 112 to provide different offset correction signals (e.g., signals 112A and 112B, respectively, in the exemplary embodiment shown) to transistors 106A-106B.

Note further that although the circuit arrangements in FIGS. 1-2 use N-type MOS (NMOS) transistors 106A-106B, other variations are possible and contemplated. For example, in some embodiments, rather than using NMOS transistors, P-type MOS (PMOS) transistors 106A-106B may be used by making appropriate modifications, persons of ordinary skill in the art will understand. Such modifications may include reversing the drains and sources of transistors 106A-106B, changing the polarities of offset correction signals 112A-112B, etc.

Another aspect of the disclosure relates to refinements to the offset correction signal(s), such as the offset correction voltage $v_{btrim}$ discussed above. The refinements take into account changes in MOSFET characteristics that arise from the application of $v_{btrim}$ to the bulk or body of the transistor.

More specifically, as noted above, offset correction circuit 112 applies a voltage to the bulk or body of MOSFETs in IC 103, such as transistors 106A-106B in the exemplary embodiment shown in FIG. 1. Changing the body or bulk voltage of a MOSFET affects its various performance characteristics, such as leakage level (hence, power consumption), threshold voltage, operating speed, and the like. In some embodiments, those changes are taken into account in setting the value of the offset correction or trim voltage, e.g., $V_{btrim}$, as described below in detail.

The threshold voltage, $V_T$, in turn depends on a number of factors, such as the voltage between the body and source of the MOSFET. Stated mathematically, $$V_T = V_{T(0)} \gamma \{\sqrt{2\phi_F - v_{BS}} - \sqrt{2\phi_F}\}.$$

or, alternatively, in terms of the source-to-body voltage, $v_{SB}$:

$$V_T = V_{T(0)} + \gamma \{\sqrt{2\phi_F + v_{SB}} - \sqrt{2\phi_F}\}.$$

In the above equations, $V_{T(o)}$ represents the threshold voltage when the source-to-body voltage (or body-to-source voltage) is set to zero, γ represents the body factor (a constant that depends on the doping levels of the body of the MOSFET), $\phi_F$ denotes a constant, $v_{BS}$ represents the total body-to-source voltage (i.e., including AC and DC components), and $v_{SB}$ denotes the total source-to-body voltage (i.e., including AC and DC components). As noted above, and as the above equations show, when the body-to-source voltage, $v_{BS}$, equals zero, the threshold voltage, $V_T$, equals $V_{T(o)}$.

Furthermore, note from the above equations that, for a finite, non-zero body factor, γ, the threshold voltage decreases as the body-to-source voltage, $v_{BS}$, increases. A decrease in the threshold voltage, $V_T$, increases the drain current, $i_D$ (assuming a given value of $v_{GS}$). Hence, given a constant gate-to-source-voltage, $v_{GS}$, increasing the body-to-source voltage, $v_{BS}$, causes the transconductance $g_m$ (i.e., the quantity $\{2K(v_{GS}-V_T)\}$) to increase.

To summarize, changes (e.g., by the application of offset correction signals, such as $V_{btrim}$) in the body-to-source voltage of the transistor result in corresponding changes in the threshold voltage of the transistor. Given that the transconductance related to the gate-to-source voltage, i.e., $g_m$, depends on the threshold voltage, application of the offset correction signals results in changes in $g_m$.

Furthermore, because, as described above, $V_{btrim}$ is selected as a function of $g_m$, the changes in $g_m$ as a result of the application of $V_{btrim}$ to the body of the transistor may be taken into account in selecting the values of the offset correction signals that offset correction circuit 112 provides. Thus, the selected value of $v_{btrim}$ may be refined to include the effects of the finite body-to-source voltage, $v_{BS}$.

Offset, such as offset voltages, arise in a variety of analog circuits. Accordingly, offset correction techniques according to various embodiments may be used in a variety of electronic circuitry that include analog circuitry (e.g., amplifiers, adders, current and voltage sources, etc.) or mixed-signal circuitry (e.g., analog to digital converters (ADCs), digital to analog converters (DACs), etc.).

In some embodiments, offset correction circuitry may be used in circuitry integrated in an IC, which may be used in a variety of circuits, blocks, subsystems, and systems, as desired. Without limitation, examples include general-purpose amplifiers, rail-to-rail amplifiers, low-noise amplifiers, analog-to-digital converters (ADCs), digital-to-analog converters (DACs), comparators, filters, analog signal-processing circuitry, power amplifiers, etc.

Figure 3:
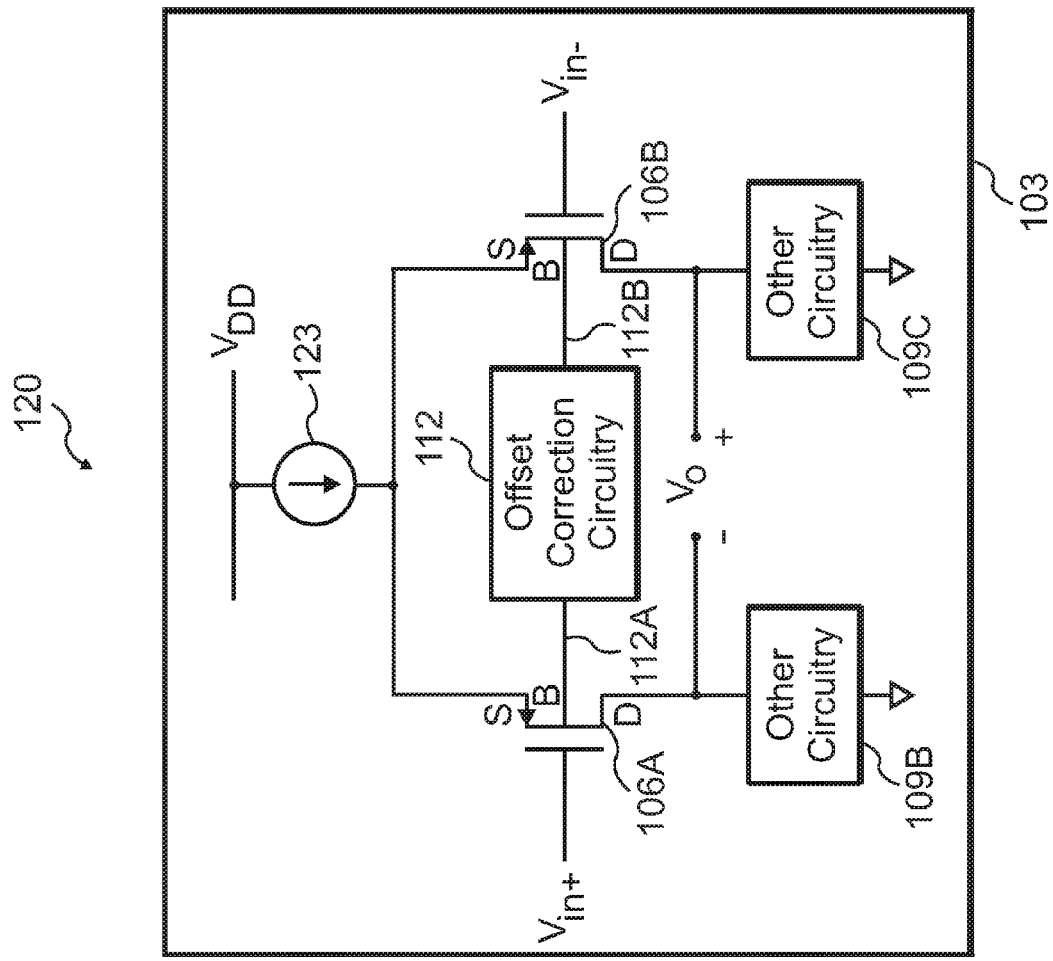
FIG. 3 shows a circuit arrangement for offset correction according to another exemplary embodiment.

One aspect of the disclosure relates to offset correction in amplifiers. FIG. 3 shows a circuit arrangement 120 for offset correction in an amplifier according to an exemplary embodiment.

More specifically, circuit arrangement 120 includes a differential amplifier (or differential pair) integrated in an IC 103. The differential amplifier includes transistors 106A-106B. A differential input voltage is applied to the gates of transistors 106A-106B, respectively. In other words, an input voltage $v_{in+}$ drives the gate of transistor 106A, whereas an input voltage $v_{in-}$ drives the gate of transistor 106B.

The sources of transistors 106A-106B are driven by current source 123. Note that, rather than using current source 123 generally, in some embodiments, a MOSFET may be used to provide a tail current to transistors 106A-106B. A similar comment applies to the circuit arrangements in FIGS. 4-6.

Referring again to FIG. 3, the drains of transistors 106A-106B couple to other circuitry 109B and 109C, respectively. The differential output voltage of the differential amplifier, $v_O$, is provided between the drains of transistors 106A-106B.

As noted above, differences between transistors 106A-106B (i.e., less than perfect matching, which is the case in a real-world, practical implementation) gives rise an offset voltage in the differential amplifier. Other mismatch in the circuit may also contribute to an overall or cumulative offset in the circuit, as discussed above. Offset correction circuit 112 may be used to trim or correct the offset voltage, e.g., input-referred offset of the differential amplifier.

More specifically, offset correction circuit 112 provides an offset correction signal (a voltage, in the example shown) 112A to the bulk or body of transistor 106A. Similarly, offset correction circuit 112 provides an offset correction signal (a voltage, in the example shown) 112B to the bulk or body of transistor 106B.

The magnitudes of offset correction signals 112A-112B may be derived, set, configured, or programmed as described above. The application of offset correction signals 112A-112B, respectively, to the bulks or bodies of transistors 106A-106B trims or corrects the offset in the differential amplifier.

Note that although circuit arrangement 120 in FIG. 3 uses PMOS transistors 106A-106B, other variations are possible and contemplated. For example, in some embodiments, rather than using PMOS transistors, NMOS transistors 106A-106B may be used by making appropriate modifications, persons of ordinary skill in the art will understand. Such modifications may include reversing the roles of the supply voltage and ground, changing the polarities of offset correction signals 112A-112B, and reversing the flow of current through current source 123, etc.

Figure 4:
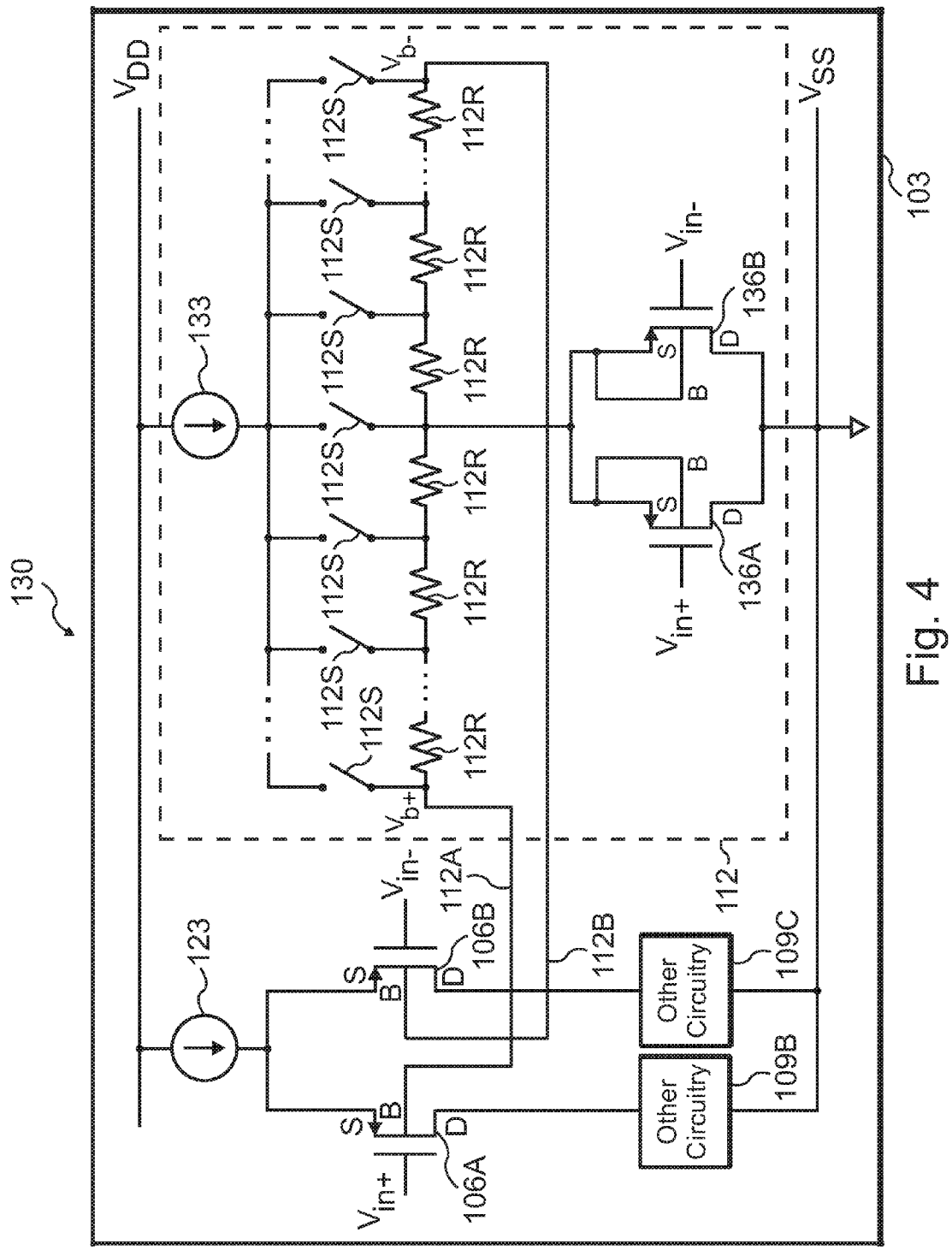
FIG. 4 depicts a circuit arrangement for offset correction according to another exemplary embodiment.
Figure 5:
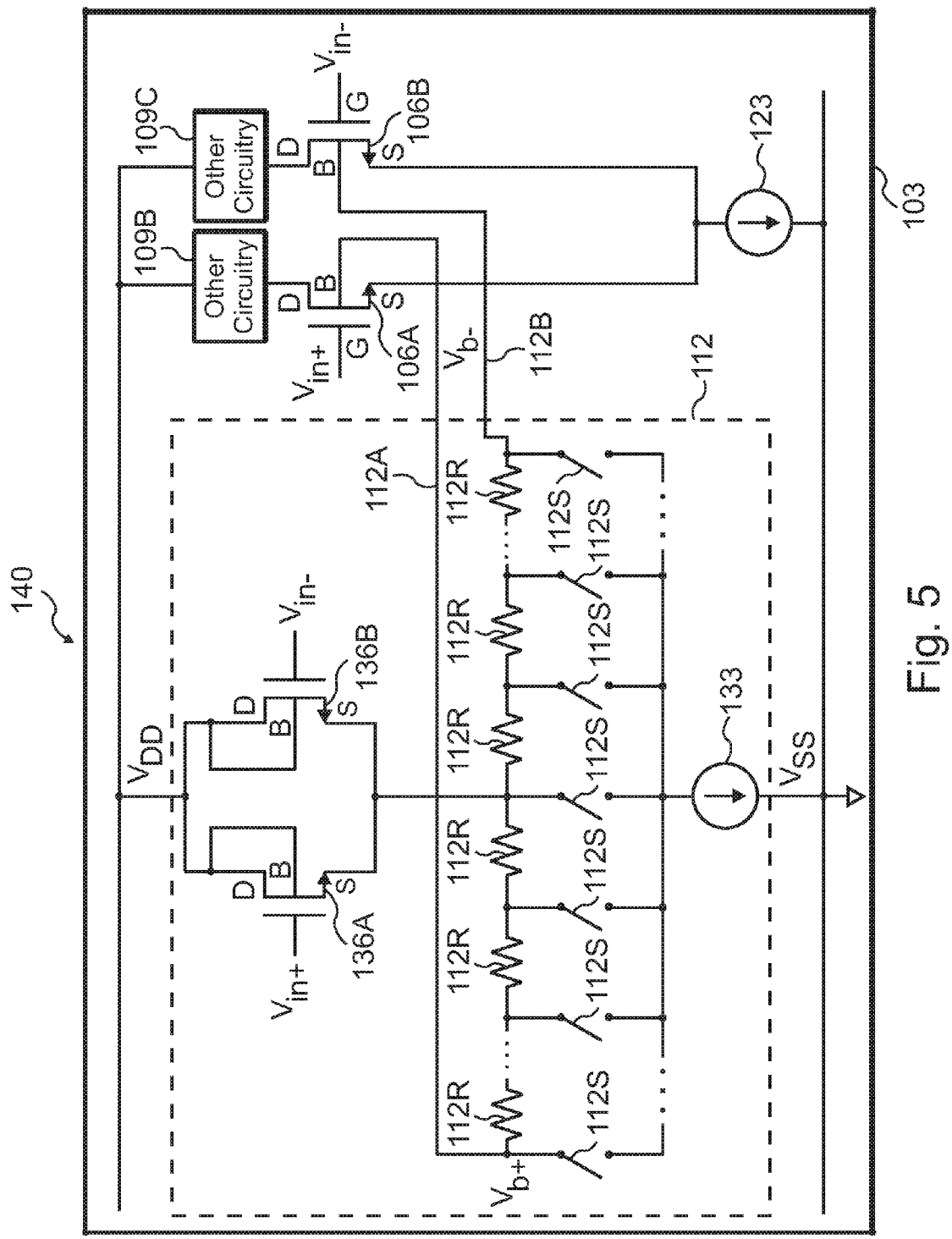
FIG. 5 illustrates a circuit arrangement for offset correction according to another exemplary embodiment.
Figure 6:
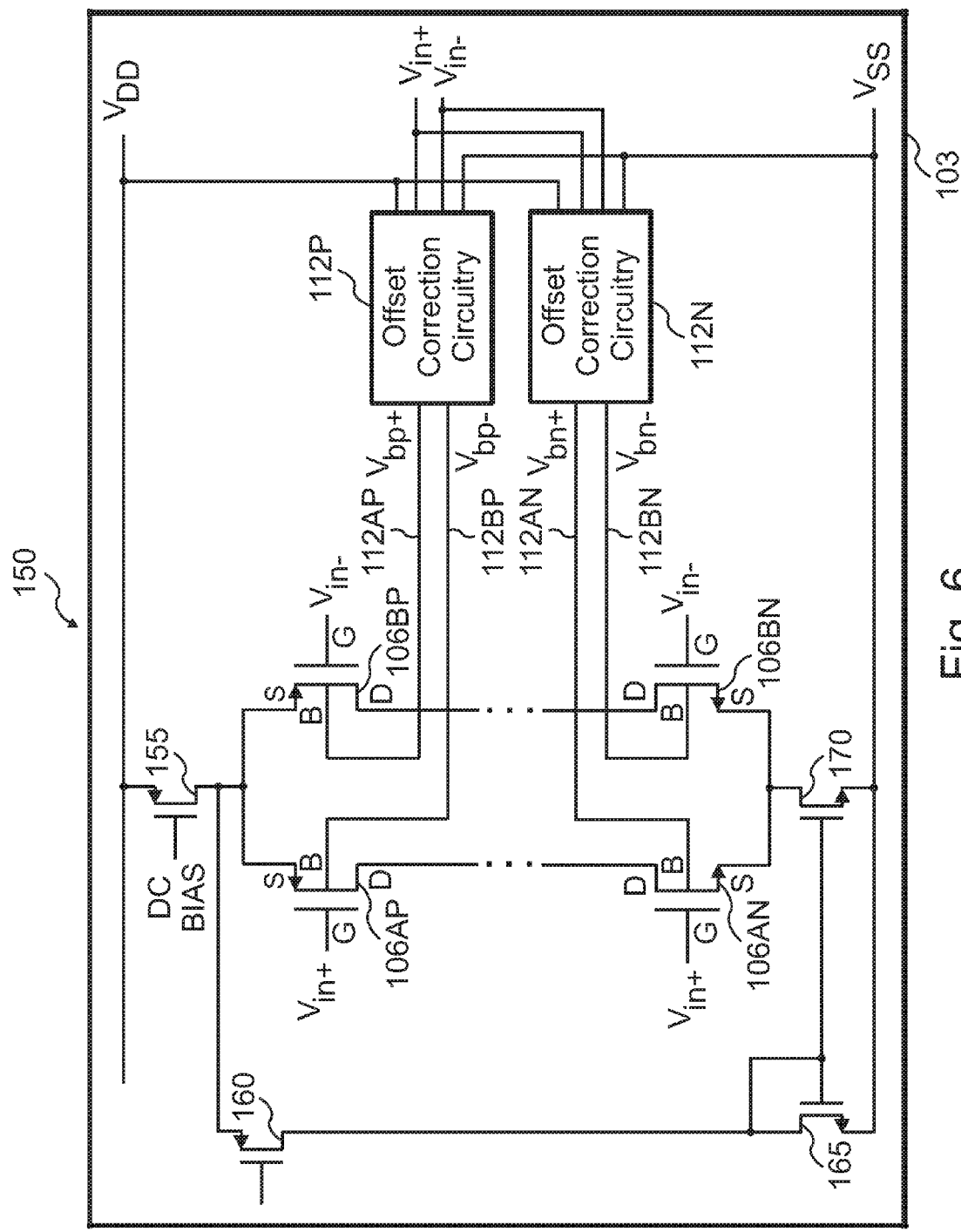
FIG. 6 depicts a circuit arrangement for offset correction according to another exemplary embodiment.

In exemplary embodiments, offset correction circuit 112 may be implemented in a number of ways to accommodate a variety of desired features, specifications, performance criteria, and the like. FIGS. 4-6 provide some examples.

FIG. 4 depicts a circuit arrangement 130 for offset correction according to an exemplary embodiment. Circuit arrangement 130 applies offset correction to a differential amplifier. The differential amplifier includes transistors 106A-106B, coupled in a similar manner as transistors 106A-106B in FIG. 3. Drains of transistors 106A-106B are coupled to other circuitry 109B-109C, respectively.

Referring again to FIG. 4, offset correction circuitry 112 provides offset correction signal 112A to the bulk or body of transistor 106A. Similarly, offset correction circuitry 112 provides offset correction signal 112B to the bulk or body of transistor 106B. Offset correction signals 112A-112B trim or correct the offset voltage of the differential amplifier, as described above in detail.

FIG. 4 shows details of offset correction circuit 112 according to the illustrated exemplary embodiment. More specifically, offset correction circuit 112 includes transistors 136A-136B, a network of switches and resistors that includes a set of switches 112S coupled to a set of resistors 112R, and current source 133.

Transistors 136A-136B are configured, designed, and/or fabricated to match transistors 106A-106B relatively closely. In some embodiments, transistors 136A-136B are configured, designed, and/or fabricated to match transistors 106A-106B as closely as possible. The degree of matching between transistors 136A-136B and transistors 106A-106B depends on a number of factors, as persons of ordinary skill in the art will understand. Those factors include design and performance specifications, available technology (e.g., semiconductor or IC fabrication technology), cost constraints, etc.

Referring again to FIG. 4, transistors 136A-136B are coupled to receive the same input voltages as transistors 106A-106B. As noted above, transistors 106A-106B receive a differential voltage, i.e., $v_{in+}$ applied to the gate of transistor 106A, and $v_{in-}$ applied to the date of transistor 106B.

Similarly, transistors 136A-136B are coupled to receive the differential voltage applied to the gates of transistors 106A-106B. Thus, the gate of transistor 136A is coupled to receive the voltage $v_{in+}$, and the gate of transistor 136B is coupled to receive the voltage $v_{in-}$.

By virtue of transistors 136A-136B having the same respective gate voltages as the gate voltages of transistors 106A-106B, offset correction circuit 112 can trim or correct the offset in the differential amplifier as the input voltage (i.e., $v_{in}=v_{in+}-v_{in-}$) of the differential amplifier changes. Thus, offset correction circuit 112 can trim or correct the offset in an adaptive manner, i.e., the offset correction voltages 112A-112B adapt or respond to the variations in the voltages applied to the gates of transistors 106A-106B (and also to the gates of transistors 136A-136B, as described above).

Stated another way, transistors 136A-136B are arranged in a differential source follower configuration. As a result, offset correction voltages 112A-112B move or swing with or follow or adapt to the common-mode voltage of the input voltage of the differential amplifier. As a result, the offset in the differential amplifier is trimmed or corrected.

As noted, offset correction circuit 112 includes a network of switches and resistors, which includes a set of switches 112S coupled to a set of resistors 112R, as FIG. 4 illustrates. Current source 133 provides a current that flows through the network of switches and resistors, i.e., through the set of switches 112S and the set of resistors 112R, and through transistor 136A and/or transistor 136B (depending on the magnitudes of the voltages applied to the respective gates of transistors 136A-136B, i.e., the input voltage to the differential amplifier).

In some embodiments, current source 133 provides an output current, I, given by:

$$I = \frac{V_{BG}}{R},$$

where $V_{BG}$ and R denote, respectively, a band-gap voltage and the resistance of one (or any, if they have equal resistances) of the resistors in the set of resistors 112R.

Offset correction voltages 112A-112B (labeled $v_{b+}$ and $v_{b-}$, respectively) are derived by tapping nodes in the network of switches and resistors that includes a set of switches 112S coupled to a set of resistors 112R. As noted above, offset correction voltages 112A-112B are coupled to the respective bodies or bulks of transistors 106A-106B. Thus, offset correction voltage 112A is coupled to the body of transistor 106A, whereas offset correction voltage 112B is coupled to the body of transistor 106B.

The magnitudes of offset correction voltages 112A-112B are in part determined by the number and position of the open and closed switches in the network of switches 112S and resistors 112R. Opening or closing individual switches in the set of switches 112S causes corresponding voltage drops across one or more of the resistors in the set of resistors 112R by virtue of the current I provided by current source 133. Thus, by closing and opening appropriate switches in the set of switches 112S, the magnitudes of offset correction voltages 112A-112B may be set, configured, adjusted, modified, etc.

A variety of alternatives are contemplated according to exemplary embodiments. For example, in some embodiments, resistors 112R have the same resistance, say, R, whereas in some embodiments, resistors 112R have different resistance values, or some resistors have the same values while others do not, etc.

Furthermore, although switches 112S are shown as general single-pole, single-throw switches, they may be implemented in a variety of ways, depending on factors such as design and performance specifications, available technology, costs and/or complexity considerations, IC area available, etc., as persons of ordinary skill in the art will understand. As illustrative examples, switches 112S may be implemented using MOSFETs, fuses, anti-fuses, laser-trimmed links, etc.

In addition, the states (i.e., whether open or closed) of switches 112S may be controlled or set during fabrication, testing, and/or operation of the circuit. For example, in some embodiments, the states of switches 112S may be controlled or set during fabrication, depending on the desired setting for each switch 112S. Similarly, the states of switches 112S may be controlled or set during the test phase of the circuit, depending on the measured characteristics of various circuit elements, such as transistors 106A-106B, transistors 136A-136B, etc.

As another example, the states of switches 112S may be controlled or set during operation of the circuit (e.g., by the user of the circuit, IC, etc.) to provide additional flexibility (e.g., if the user decides to change the operating points of transistors 106A-106B and, hence, their respective transconductances. A combination of the techniques discussed above may also be used, as desired.

Although offset correction circuit 112 in FIG. 4 has been described in relation to an amplifier, offset correction circuit 112 may be used in other type of circuitry by making appropriate modifications, as persons of ordinary skill in the art will understand. Such modifications may include a change in the numbers and/or values of resistors 112R and/or switches 112S, etc., as persons of ordinary skill in the art will understand.

Note that although circuit arrangement 130 shows a differential amplifier implemented using PMOS transistors 106A-106B, other circuit arrangements are possible. For example, the offset correction techniques may be applied to a differential amplifier implemented using NMOS transistors. FIG. 5 illustrates a circuit arrangement 140 for this scenario.

More specifically, circuit arrangement 140 includes a differential amplifier implemented using NMOS transistors.

Circuit arrangement 140 is similar to circuit arrangement 130 (see FIG. 4), with appropriate modifications made to accommodate NMOS transistors. Thus, referring to FIG. 5, transistors 106A-106B are NMOS transistors, as are transistors 136A-136B. The direction of current flow for current source 123 and current source 133 has been reversed, etc. Offset correction circuit 112 provides offset correction signals 112A-112B to the bulks or bodies of transistors 106A-106B, respectively.

Although offset correction circuit 112 in FIG. 5 has been described in relation to an amplifier, offset correction circuit 112 may be used in other type of circuitry by making appropriate modifications, as persons of ordinary skill in the art will understand. Such modifications may include a change in the numbers and/or values of resistors 112R and/or switches 112S, etc., as persons of ordinary skill in the art will understand.

The disclosed offset correction techniques may also be applied to circuits that include both PMOS and NMOS transistors. For example, the offset correction techniques may be applied to PMOS and NMOS transistors in a rail-to-rail (i.e., the inputs may swing from one supply rail (e.g., supply voltage $V_{DD}$) to another supply rail (e.g., supply ground $V_{SS}$)) differential amplifier. FIG. 6 depicts a circuit arrangement 150 for this scenario.

Circuit arrangement 150 includes a differential amplifier or differential pair implemented using PMOS transistors 106AP-106BP. Circuit arrangement 150 also includes a differential amplifier or differential pair implemented using NMOS transistors 106AN-106BN. Use of the two differential amplifiers allows circuit arrangement 150 to provide the rail-to-rail functionality.

In addition, circuit arrangement 150 includes PMOS transistors 155 and 160, and NMOS transistors 165 and 170 to facilitate the rail-to-rail functionality, as persons of ordinary skill in the art will understand. In response to a DC bias, PMOS transistor 155 provides a tail current. PMOS transistor 160 is used to steer the tail current between the PMOS and NMOS differential pairs, described above, as the input signal swings from one supply rail to another supply rail.

Diode-connected NMOS transistor 165 has the same (or nearly the same, because of circuit imperfections) drain current as does PMOS transistor 160. NMOS transistor 165 and NMOS transistor 170 are coupled in a current-mirror configuration.

As a result, NMOS transistor 170 has the same (or nearly the same, because of circuit imperfections) drain current as NMOS transistor 165.

Circuit arrangement 150 also includes offset correction circuit 112P and offset correction circuit 112N. Offset correction circuit 112P provides offset correction signals 112AP and 112BP to the differential amplifier that includes PMOS transistors 106AP-106BP. Conversely, offset correction circuit 112N provides offset correction signals 112AN and 112BN to the differential amplifier that includes NMOS transistors 106AN-106BN.

Generally, offset correction circuit 112P may be implemented in a variety of ways. For example, offset correction circuit 112P may be implemented as shown in FIG. 4. Referring again to FIG. 6, generally, offset correction circuit 112N may be implemented in a variety of ways. For example, offset correction circuit 112N may be implemented as shown in FIG. 5.

Referring again to FIG. 6, consider the situation where offset correction circuit 112P is implemented as shown in FIG. 4 and offset correction circuit 112N is implemented as shown in FIG. 5. When the tail current steers between the differential amplifier that includes PMOS transistors 106AP-106BP and the differential amplifier that includes NMOS transistors 106AN-106BN, the DC bias of the corresponding PMOS and NMOS transistors in offset correction circuit 112P and offset correction circuit 112N, respectively, does not change. As a result, offset correction voltages 112AP, 112BP, 112AN, and 112BN trim or correct the offset corrections of the respective PMOS-implemented and NMOS-implemented differential amplifiers.

Although offset correction circuits 112P-112N in FIG. 6 have been described in relation to an amplifier, offset correction circuits 112P-112N may be used in other type of circuitry by making appropriate modifications, as persons of ordinary skill in the art will understand. For example, such modifications may include a change in the numbers and/or values of resistors 112R and/or switches 112S, etc., as persons of ordinary skill in the art will understand.

Offset correction circuits in various embodiments according to the disclosure provide a number of benefits. Because the offset correction circuits do not use a clock or digital switching circuitry, they allow operation with or in circuitry with low-power consumption. More specifically, MOS circuitry, including complementary MOS (CMOS) circuitry uses more power as the switching frequency of the transistors in the circuitry increases. By using static, rather than switching, circuitry, offset correction circuits according to the disclosure provide lower-power operation.

Furthermore, offset correction circuits according to the disclosure provide less impact on the common-mode rejection performance. As persons of ordinary skill in the art will understand, common-mode rejection is a figure of merit or characteristic of electronic circuitry, such as amplifiers, in particular, differential amplifiers.

As persons of ordinary skill in the art understand, one may apply the disclosed concepts effectively to various circuit arrangements and electronic circuitry. Some of the examples described in this document, which refer to offset correction in amplifiers such as a differential pair, constitute merely illustrative applications. Such examples are not intended to limit the application of the disclosed concepts to other circuits by making appropriate modifications, as persons of ordinary skill in the art will understand.

Referring to the Figs., persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only. Where applicable, the Figs. might or might not be drawn to scale, as persons of ordinary skill in the art will understand.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An apparatus comprising:
   a first field effect transistor (FET) coupled in a circuit, the first FET having a body;
   a second FET coupled in the circuit, the second FET having a body, wherein the circuit has an offset because of a mismatch; and
   an offset correction circuit coupled to the body of the first FET and to the body of the second FET to provide a first offset correction signal to the body of the first FET and a second offset correction signal to the body of the second FET, wherein the offset correction circuit comprises a third FET and a fourth FET coupled in a source follower configuration.

2. The apparatus according to claim 1, wherein application of the first offset correction to the body of the first FET changes a first transconductance of the first FET.

3. The apparatus according to claim 2, wherein application of the second offset correction to the body of the second FET changes a first transconductance of the second FET.

4. The apparatus according to claim 2, wherein the first transconductance of the first FET depends on a voltage between the body and a gate of the first FET.

5. The apparatus according to claim 3, wherein the first transconductance of the second FET depends on a voltage between the body and a gate of the second FET.

6. The apparatus according to claim 1, wherein the first FET comprises a metal oxide semiconductor FET (MOSFET), and wherein the second FET comprises a MOSFET.

7. The apparatus according to claim 1, wherein the first and second FETs are coupled in a differential amplifier configuration.

8. The apparatus according to claim 1, wherein the offset correction circuit further comprises a set of switches and a set of resistors, coupled to the third and fourth FETs, to provide the first offset correction signal to the body of the first FET and the second offset correction signal to the body of the second FET.

9. An electronic apparatus comprising:
   a first differential amplifier including a first transistor and a second transistor, the first transistor having a body, and the second transistor having a body, wherein electrical characteristics of the first transistor differ from electrical characteristics of the second transistor; and
   a first offset correction circuit, comprising:
      a first current source;
      third and fourth transistors coupled to the first current source; and
      a first network of a set of switches and a set of resistors coupled to the third and fourth transistors to provide first and second offset correction signals to the body of the first transistor and to the body of the second transistor, respectively.

10. The electronic apparatus according to claim 9, wherein application of the first offset correction signal to the body of the first transistor changes a body to source voltage of the first transistor, and wherein application of the second offset correction signal to the body of the second transistor changes a body to source voltage of the second transistor.

11. The electronic apparatus according to claim 9, wherein the first and second offset correction circuits follow a differential input voltage of the first differential amplifier.

12. The electronic apparatus according to claim 11, wherein a differential input voltage of the first differential amplifier is applied to a gate of the first transistor and to a gate of the second transistor, and wherein the differential input voltage of the first differential amplifier is applied to a gate of the third transistor and to a gate of the fourth transistor.

13. The electronic apparatus according to claim 9, further comprising:
   a second differential amplifier coupled to the first differential amplifier to provide a differential amplifier rail-to-rail functionality, the second differential amplifier including a fifth transistor and a sixth transistor, the fifth transistor having a body, and the sixth transistor having a body, wherein electrical characteristics of the fifth transistor differ from electrical characteristics of the sixth transistor; and
   a second offset correction circuit, comprising:
      a second current source;
      seventh and eighth transistors coupled to the second current source; and
      a second network of a set of switches and a set of resistors coupled to the seventh and eighth transistors to provide third and fourth offset correction signals to the body of the fifth transistor and to the body of the sixth transistor, respectively.

14. The electronic apparatus according to claim 13, wherein the first, second, third, and fourth transistors comprise P-type metal oxide semiconductor field effect transistors (MOSFETs), and wherein the fifth, sixth, seventh, and eighth transistors comprise N-type MOSFETs.

15. A method of correcting an offset in a circuit including first and second field effect transistors (FETs), wherein the circuit has an offset because of a mismatch, the method comprising:
   generating a first offset correction signal by using third and fourth FETs coupled in a source follower configuration;
   generating a second offset correction signal by using the third and fourth FETs;
   applying the first offset correction signal to a body of the first FET; and
   applying the second offset correction signal to a body of the second FET.

16. The method according to claim 15, wherein application of the first offset correction to the body of the first FET changes a transconductance of the first FET.

17. The method according to claim 16, wherein application of the second offset correction to the body of the second FET changes a transconductance of the second FET.

18. The method according to claim 17, wherein the transconductance of the first FET depends on a voltage between the body and a gate of the first FET.

19. The method according to claim 18, wherein the transconductance of the second FET depends on a voltage between the body and a gate of the second FET.

20. The method according to claim 15, wherein a gate of the third FET is coupled to receive a gate voltage applied to the first FET, and wherein the a gate of the fourth FET is coupled to receive a gate voltage applied to the second FET.

* * * * *